United States Patent
Hwang et al.

(10) Patent No.: US 7,755,523 B2
(45) Date of Patent: Jul. 13, 2010

(54) ADC USE WITH MULTIPLE SIGNAL MODES

(75) Inventors: Chien-Meen Hwang, San Jose, CA (US); Ann P. Shen, Saratoga, CA (US)

(73) Assignee: NanoAmp Mobile, Inc., Sunnyvale, CA (US)

( * ) Notice: Subject to any disclaimer, the term of this patent is extended or adjusted under 35 U.S.C. 154(b) by 0 days.

(21) Appl. No.: 12/236,383

(22) Filed: Sep. 23, 2008

(65) Prior Publication Data
US 2009/0079611 A1 Mar. 26, 2009

Related U.S. Application Data

(60) Provisional application No. 60/974,689, filed on Sep. 24, 2007.

(51) Int. Cl.
*H03M 1/00* (2006.01)
(52) U.S. Cl. ...................... 341/139; 341/155
(58) Field of Classification Search ............... 341/139
See application file for complete search history.

(56) References Cited

U.S. PATENT DOCUMENTS

| | | | |
|---|---|---|---|
| 4,910,752 A | 3/1990 | Yester, Jr. et al. | |
| 5,917,865 A | 6/1999 | Kopmeiners et al. | |
| 6,504,863 B1 | 1/2003 | Hellmark | |
| 6,515,609 B1 | 2/2003 | Moulsley | |
| 6,580,383 B1 | 6/2003 | Devendorf et al. | |
| 6,624,776 B2 | 9/2003 | Oliveira | |
| 6,686,957 B1 | 2/2004 | Johnson et al. | |
| 6,999,011 B2 * | 2/2006 | Case et al. | 341/118 |
| 7,541,956 B1 * | 6/2009 | Lee | 341/139 |
| 7,605,731 B2 * | 10/2009 | Van Veldhoven | 341/139 |
| 2006/0183451 A1 | 8/2006 | Demir et al. | |
| 2007/0041481 A1 | 2/2007 | Malkemes et al. | |

FOREIGN PATENT DOCUMENTS

JP 2005-323123 11/2005

OTHER PUBLICATIONS

PCT International Search Report and Written Opinion issued in International Application No. PCT/US2008/077533 mailed Mar. 30, 2009.
Dwight U. Thompson et al., "A 15-b Pipelined CMOS Floating-Point A/D Converter," Brief Papers, IEEE Journal of Solid-State Circuits, vol. 36, No. 2, Feb. 2001, pp. 299-303.

* cited by examiner

*Primary Examiner*—Khai M Nguyen
(74) *Attorney, Agent, or Firm*—Fish & Richardson P.C.

(57) ABSTRACT

A signal is received and whether a signal mode of the signal is a first signal mode or a second signal mode is determined. A gain of a variable gain amplifier is adjusted to a first gain value if the signal mode of the signal is determined to be the first signal mode or a second gain value if the signal mode of the signal is determined to be the second signal mode. The signal is amplified with the variable gain amplifier by the first gain value or the second gain value. The signal is converted to a digital signal with an analog to digital converter after the signal is amplified with the variable gain amplifier by the first gain value or the second gain value.

28 Claims, 5 Drawing Sheets

ADC USE WITH MULTIPLE SIGNAL MODES

CROSS REFERENCE TO RELATED APPLICATIONS

This application claims the benefit of priority from U.S. Provisional Application entitled "ADC DYNAMIC RANGE ADJUSTMENT," Application No. 60/974,689 filed Sep. 24, 2007, the disclosure of which is incorporated by reference.

TECHNICAL FIELD

This disclosure relates to analog-to-digital converters (ADCs).

BACKGROUND

The use of digital processing can decrease power consumption, size, cost, complexity, as well as ease difficulties in manufacturing. However, many signals in device operation are represented as analog signals. As such, an ADC can be used to convert the analog signals to digital signals for digital signal processing (DSP). An ADC can be used in receiver, baseband, radio frequency (RF), as well as intermediate frequency (IF) blocks of a communications system. An ADC can be a component, for example, in a digital receiver.

SUMMARY

According to one general aspect, a method comprises receiving a signal and determining whether a signal mode of the signal is a first signal mode or a second signal mode. The method also includes adjusting a gain of a variable gain amplifier to a first gain value if the signal mode of the signal is determined to be the first signal mode or a second gain value if the signal mode of the signal is determined to be the second signal mode. The method further includes amplifying the signal with the variable gain amplifier by the first gain value or the second gain value and converting the signal to a digital signal with an analog to digital converter after the signal is amplified with the variable gain amplifier by the first gain value or the second gain value.

These and other implementations can optionally include one or more of the following features. For example, the determining whether the signal mode of the signal is the first signal mode or the second signal mode can include receiving an instruction signal at an automatic gain controller indicating that the signal is the first signal mode or that the signal is the second signal mode. Adjusting the gain of the variable gain amplifier to the first gain value can include sending a first control signal from an automatic gain controller to the variable gain amplifier and the adjusting the gain of the variable gain amplifier to the second gain value can include sending a second control signal from the automatic gain controller to the variable gain amplifier.

The first signal mode can comprise comprises a requirement for a signal to noise ratio or signal to quantization noise ratio that is higher than a signal to noise ratio or signal to quantization ration of a requirement of the second signal mode and the first gain value can comprise a higher value than the second gain value. The signal as amplified by the first gain value can enable the analog to digital converter to meet the higher signal to noise ratio or signal to quantization noise ratio while the signal as amplified by the second gain value can not enable the analog to digital converter to meet the higher signal to noise ratio or signal to quantization noise ratio. The first signal mode can comprises High-Speed Downlink Packet Access and the second signal mode can comprise a basic Wideband Code Division Multiple Access.

The method can also include monitoring the signal for an interference. The monitoring of the signal for the interference can be initiated based on the determination that the signal mode of the signal is the second signal mode and can be maintained only when the signal mode of the signal is determined to be of the second signal mode such that the second signal mode includes an interference or sensitivity requirement. The signal as amplified by the first gain value can not enable the analog to digital converter to meet the interference or sensitivity requirement and the signal as amplified by the second gain value can enable the analog to digital converter to meet the interference or sensitivity requirement. The method can further include determining the signal includes the interference based on the monitoring of the signal such that the adjusting the gain of the variable gain amplifier to the second gain value based on the determination that the signal mode of the signal is the second signal mode can include adjusting the gain of the variable gain amplifier to the second gain value in response to the determination that the signal includes the interference.

Also, the method can include determining that the signal does not include the interference based on the monitoring of the signal and adjusting the gain of the variable gain amplifier to a third gain value based on the determination that the signal does not include the interference such that the third gain value is between the second gain value and the first gain value. Further, the method can include determining that the signal mode of the signal is a third signal mode such that the third signal mode comprises a requirement for a signal to noise ratio or signal to quantization noise ratio that is higher than a signal to noise ratio or signal to quantization noise ratio of a requirement of the second signal mode, adjusting the gain of the variable gain amplifier to a fourth gain value after the determination that the signal mode of the signal is the third signal mode such that the fourth gain value is less than the first gain value, amplifying the signal with the variable gain amplifier by the fourth gain value, and converting the signal to the digital signal with the analog to digital converter after the signal is amplified by the fourth gain value with the variable gain amplifier. The fourth gain value can be equal to or greater than the second gain value.

The method can additionally include determining whether the signal includes the interference based on the monitoring of the signal for the interference, after determining that the signal mode is the third signal mode, adjusting the gain of the variable gain amplifier to a fifth gain value if the signal does not include the interference such that the fifth gain value is less than the first gain value, amplifying the signal with the variable gain amplifier by the fifth gain value, and converting the signal to the digital signal with the analog to digital converter after the signal is amplified by the fifth gain value with the variable gain amplifier. The fifth gain value can be greater than the second gain value. Monitoring the signal for the interference can comprise monitoring a power level of the signal.

According to a second general aspect, a system comprises a variable gain amplifier configured to amplify a signal with an adjustable gain. The system also includes a gain control component configured to adjust a gain of the variable gain amplifier to a first gain value if a signal mode of the signal is determined to be a first signal mode and to adjust the gain of the variable gain amplifier to a second gain value if the signal mode of the signal is determined to be a second signal mode such that the second gain value is different than the first gain value. The system further includes an analog to digital converter configured to convert the signal to a digital signal after the signal has been amplified by the variable gain amplifier with the first gain value or the second gain value.

These and other implementations can optionally include one or more of the following features. For example, the gain control component can be configured to receive an instruction signal indicating that the signal mode of the signal is the first signal mode or receive an instruction signal indicating that the signal mode of the signal is the second signal mode. The first signal mode can comprise a requirement for a signal to noise ratio or signal to quantization noise ratio that is higher than a signal to noise ratio or signal to quantization noise ratio of a requirement of the second signal mode, the second signal mode can also include an interference or sensitivity requirement, and the first gain value can be higher than the second gain value. The analog to digital converter can be configured to meet the second signal mode's signal to noise ratio or signal to quantization noise ratio and the interference or sensitivity requirement in converting the signal to the digital signal after the signal has been amplified by the second gain value and the analog to digital converter can be configured to meet the first signal mode's signal to noise ratio or signal to quantization noise ratio in converting the signal to the digital signal after the signal has been amplified by the first gain value.

The gain control component can be configured to monitor the signal for an interference. To monitor the signal for the interference, the gain control component can be configured to receive and monitor a power of an input signal to the variable gain amplifier. The gain control component can be configured to initiate monitoring of the signal for the interference based on the determination that the signal mode of the signal is the second signal mode and maintain monitoring of the signal for the interference only when the signal mode of the signal is determined to be the second signal mode such that the second signal mode includes an interference requirement and a sensitivity requirement. The analog to digital converter can be configured to meet the interference and sensitivity requirements in converting the signal to the digital signal after it has been amplified by the second gain value. The first signal mode can comprise a requirement for a signal to noise ratio or signal to quantization noise ratio that is higher than a signal to noise ratio or signal to quantization noise ration of a requirement of the second signal mode and the first gain value can be higher than the second gain value.

The gain control component can be configured to adjust the gain of the variable gain amplifier to the second gain value if the signal mode of the signal is determined to be the second signal mode and if the monitoring of the signal does not result in a determination that the signal includes the interference, and the analog to digital converter can be configured to convert the signal to the digital signal after it has been amplified by the third gain value. The gain control component can be configured to adjust the gain of the variable gain amplifier to a fourth gain value if the signal mode of the signal is determined to be a third signal mode such that the third signal mode comprises a requirement for a signal to noise ratio or signal to quantization noise ratio that is higher than a signal to noise ratio or signal to quantization noise ratio of a requirement of the second signal mode and the fourth gain value is equal to or greater than the second gain value, and the analog to digital converter can be configured to convert the signal to the digital signal after the signal has been amplified by the fourth gain value. The gain control component can be configured to adjust the gain of the variable gain amplifier to a fifth gain value if the signal mode of the signal is determined to be a third signal mode and the signal is determined not to include the interference, such that the fifth gain value is less than the first gain value and such that the analog to digital converter is configured to convert the signal amplified to the digital signal by the fifth gain value.

According to a third general aspect, a receiver comprises an antenna configured to receive a signal and a radio frequency filter configured to filter the received signal. The receiver also includes a low noise amplifier configured to amplify the signal after it has been filtered by the radio frequency filter and a mixer configured to mix the signal with a local oscillator signal after it has been amplified by the low noise amplifier. The receiver further includes a variable gain amplifier configured to amplify the signal with an adjustable gain after it has been mixed by the mixer. In addition, the receiver includes a gain control component configured to adjust a gain of the variable gain amplifier to a first gain value if a signal mode of the signal is determined to be a first signal mode or adjust the gain of the variable gain amplifier to a second gain value if a signal mode of the signal is determined to be a second signal mode such that the second gain value is different than the first gain value. Moreover, the receiver includes an analog to digital converter configured to convert the signal to a digital signal after the signal has been amplified by the variable gain amplifier with the first gain value or the second gain value.

These and other implementations can optionally include one or more of the following features. For example, the first signal mode can include a signal-to-noise ratio requirement that is higher than a signal-to-noise ratio requirement of the second signal mode, the first signal mode can not include a blocker requirement, and the second signal mode can include a blocker requirement. The second signal mode can comprises a basic rate Wideband Code Division Multiple Access and the first signal mode can be compliant with High-Speed Downlink Packet Access, High-Speed Uplink Packet Access, High-Speed Downlink Packet Access Plus, or Long Term Evolution.

According to a fourth general aspect, a method comprises receiving a signal such that a signal mode of the signal is initially a first signal mode and later adjusted to a second signal mode and determining that the signal mode of the signal is the first signal mode. The method also includes adjusting a gain of a variable gain amplifier to a first gain value after the determination that the signal mode of the signal is the first signal mode and amplifying the signal with the variable gain amplifier by the first gain value. The method further includes converting the signal to a digital signal with an analog to digital converter after the signal is amplified by the first gain value with the variable gain amplifier and determining that a signal mode of the signal is the second signal mode. The method additionally includes adjusting the gain of the variable gain amplifier to a second gain value after the determination that the signal mode of the signal is the second signal mode such that the second gain value is different than the first gain value. Finally, the method includes amplifying the signal with the variable gain amplifier by the second gain value and converting the signal to a digital signal with the analog to digital converter after the signal is amplified by the second gain value with the variable gain amplifier.

The details of one or more implementations are set forth in the accompanying drawings and the description below. Other features will be apparent from the description and drawings, and from the claims

DETAILED DESCRIPTION

Figure 1:
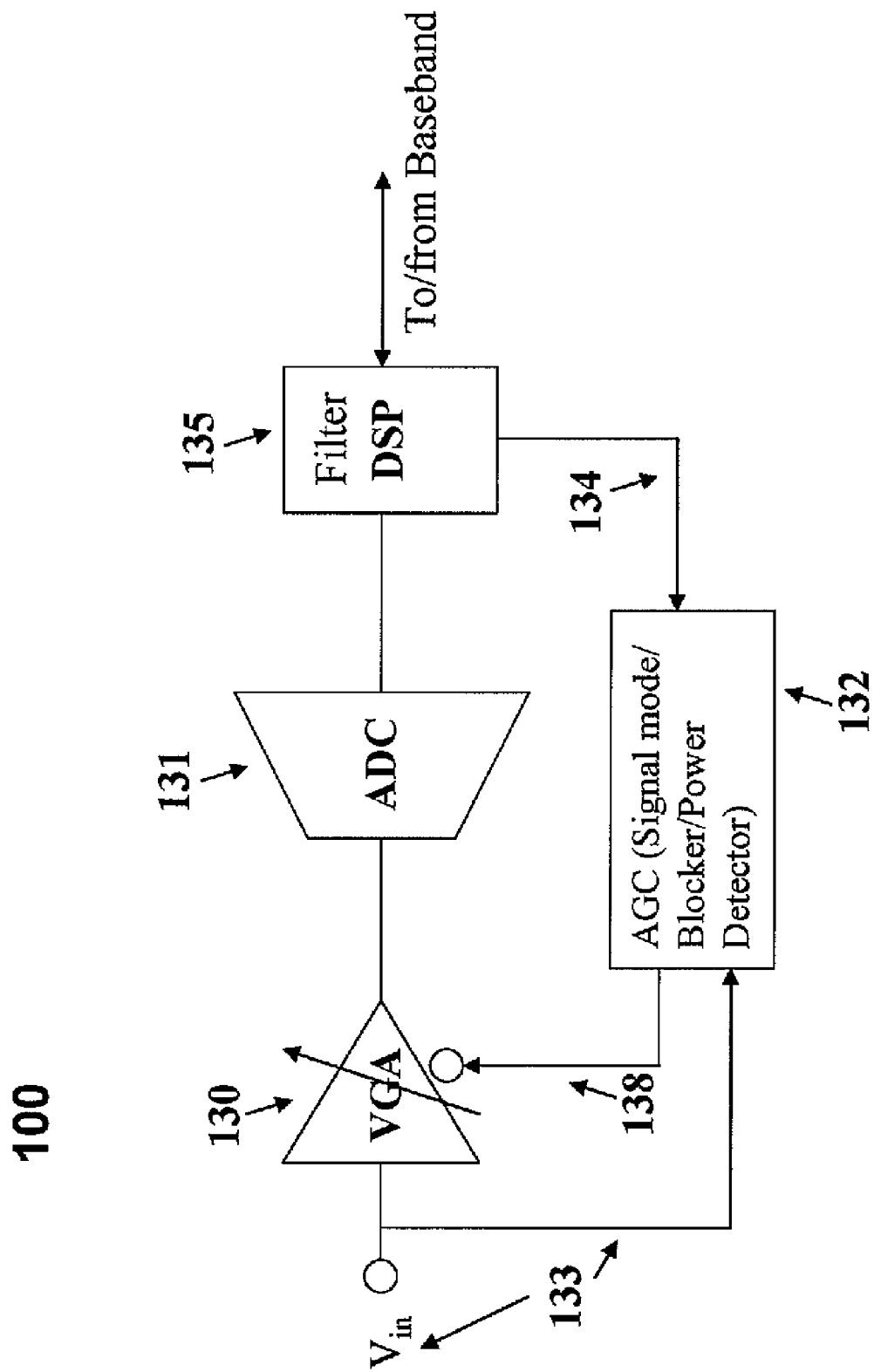
FIG. 1 is schematic of an example of an analog-to-digital converter with automatic gain control.

In many receiver applications, the desired component of a received signal can have a low voltage or power level while an unwanted component of the received signal can have a significantly larger voltage or power level. The ADC's characteristics, such as an ADC's dynamic range, may therefore be important to properly obtaining the desired component of a signal. The dynamic range of an ADC is the range of signal amplitudes that the ADC can resolve to be represented by the number of output bits. As the performance of communication systems becomes more demanding, the required dynamic range of the ADC can increase. By minimizing the required dynamic range of an ADC, the required circuit complexity, power, cost, and downstream digital signal processing may all be able to be reduced.

Modem receiver designs for a single standard or a multi-standard receiver may require the ability to operate at different modulation schemes within one or more standards. The modulation schemes may include, for example, the Wideband Code Division Multiple Access' (WCDMA) basic rate, basic WCDMA or just WCDMA, Quadrature Phase Shift Keying (QPSK), the High-Speed Downlink Packet Access' (HSDPA), Quadrature Amplitude Modulation (16QAM and 64 QAM), High-Speed Uplink Packet Access' (HSUPA) dual channel QPSK, higher data rate High-Speed Packet Access Plus' (HSPA+) (16QAM, 64QAM), multiple-input and multiple-output (MIMO) in WCDMA, Gaussian Minimum Shift Keying (GMSK) for Global System for Mobile Communications (GSM) and the $3\pi/8$-shift key (8PSK) for Enhanced Data GSM environment (EDGE). In addition, other higher data rate mobile signal modulation schemes, for example, the 3G Partnership Project (3GPP) Long Term Evolution (LTE), are constantly being developed.

When used in a single- or multi-standard receiver, an ADC design may need to meet system sensitivity and interference (blocker) requirements according to one or more signal modes for a particular modulation scheme or standard. That is, the ADC may be required to have a dynamic range wide enough to have the capabilities to receive signals including the desired signal combined with the highest interference or unwanted signals according to a system specification requirement for a particular mode. The same ADC design may also be required to keep quantization noise from the ADC small enough so the highest SNR and sensitivity requirements meet the requirements of a different mode.

One approach to enabling a single receiver to operate using different modulation schemes is to use multiple ADCs within the device. Another approach is using a single ADC to process signals of different modulation schemes. The single ADC approach can require less cost, chip area, and power. When using a single ADC for signals of different modulation schemes, the dynamic range of the ADC may need to meet varying SNR, SQNR, sensitivity, bandwidth, and/or blocker specification requirements. For example, when using one ADC for both WCDMA and the HSDPA standards, the dynamic range of the ADC may need to be able to meet the higher (relative to WCDMA) HSDPA SNR requirement as well as the WCDMA blocker requirement.

For example, for WCDMA, the basic modulation scheme can use QPSK, which has a high blocker requirement (relative to HSDPA) (e.g., in-band and out-of-band signals). In contrast, HSDPA uses 16QAM or 64 QAM modulation and, relative to WCDMA, has more stringent SNR and/or SQNR requirements but with more lenient blocker requirements (HSDPA can have no blocker requirement).

The architectures of ADCs have generally been designed to adapt to wider effective dynamic ranges, such as a sigma-delta ADC architecture and other architectures. To assist ADCs in meeting the requirements, a variable gain amplifier (VGA) controlled by an automatic gain controller (AGC) can been used to alleviate the range of the signal input into the ADC. AGC schemes can adjust the VGA gain solely based on the received-signal-strength-indicator (RSSI) feedback.

Additional techniques used instead of or in addition to the RSSI alone technique can reduce the required ADC dynamic range allocated to resolve signals of different modes (e.g., different SNR and/or blocker requirements). Such a reduction can simplify the ADC design and reduce the chip area, power, and cost requirements. For example, in some implementations, a full-scale basic WCDMA ADC can have a dynamic range of approximately 50 dB while an HSDPA signal can require a dynamic range of approximately 80 dB. Various implementations of the techniques described below can be used such that an ADC of 50 dB is able to process signals of both WCDMA and HSDPA signal modes. Accordingly, various implementations can allow a single ADC to be used while meeting the appropriate requirements (e.g., SNR and blocking requirements) in digital communication systems with different signal modes, but with a dynamic range that is less than the dynamic range typically required by the more stringent signal requirements.

FIG. 1 is a schematic 100 of an example of an ADC system with a VGA 130, an AGC 132, and a digital filter in a DSP 135 to filter out interferences. In the schematic 100, the ADC 131 can be used to resolve (or process) input signals of different modes (e.g., having different SNR and/or blocker requirements). When the ADC 131 is used with a first signal mode having a lower SNR requirement than a second signal mode, the appropriate dynamic range of the ADC 131 can, in some implementations, be determined according to the requirements of the lower SNR mode.

The input signal $V_{in}$ 133 and a control output 134 of the DSP 135 are coupled to the AGC 132. The signals 133 and 134 can enable detection of modes and blockers of signals. The AGC 132 can determine the signal mode from, for example, baseband instructions, the measured blocker size, signal power and/or signal strength by using the information fed to the AGC. For example, input signal 133 can provide information to the AGC 132 that is reflective of the input signal SNR, power, interference (blocker) and/or strength. The DSP 135 control output signal 134 can provide instructions from the baseband regarding the signal mode and/or information reflective of the signal SNR and/or SQNR system requirement.

In various implementations, the ADC 131 is designed with the dynamic range appropriate to process the full peak-topeak amplitude of a signal within available modes with a lower SNR (relative to other modes) and a higher (relative to other modes) blocker requirements rather than available modes with a higher SNR and no or little blocker requirements. For instance, in a receiver that receives both WCDMA and HSDPA signals, the ADC 131 can be designed with a dynamic range according to the SNR and blocking requirements of WCDMA, which has lower SNR and higher blocking requirements than HSPDA. Such an ADC 131 can be sufficient to cover the weakest desired signal and the strongest blocker level of a basic WCDMA signal.

In various implementations, when the signal changes from a first mode to a second mode with a higher SNR (e.g., switch to an HSDPA alert from WCDMA), the AGC 132 can boost the gain of the VGA by the difference of the SNR and/or SQNR levels for the two modes using a control signal 138 from the AGC 132 to a control input of the VGA 130. For example, if an HSDPA alert is received by the AGC 132, the gain of the VGA 130 can be boosted by approximately 30 dB (the difference between the SNR requirements for basic WCDMA and HSDPA), thereby enabling the same ADC 131 to be used to digitize the HSDPA signal. The different values used to adjust a gain of the VGA 130 can be pre-determined or calculated by the AGC 132 dynamically and stored in a table which is internal or external to the AGC circuit.

Also, if it is determined that the incoming signal has a lower SNR requirement (e.g., WCDMA versus HSDPA) and the AGC 132 detects no blocker signal or a very small blocker signal, the AGC 132 can adjust the VGA 130 gain to a higher gain (such as its maximum gain) to further improve the ADC 131 performance using the control signal 138. If, on the other hand, the AGC 132 detects a large blocker signal, the AGC 132 can set the gain of the VGA 130 to a lower gain value (such as the minimum gain), allowing the ADC 131 to retain enough dynamic range for the incoming signal (e.g., WCDMA) to include a large blocker signal. The low-pass filter in the DSP 135 can be responsible for filtering out the blocker signal and can have other processing functions.

Figure 2:
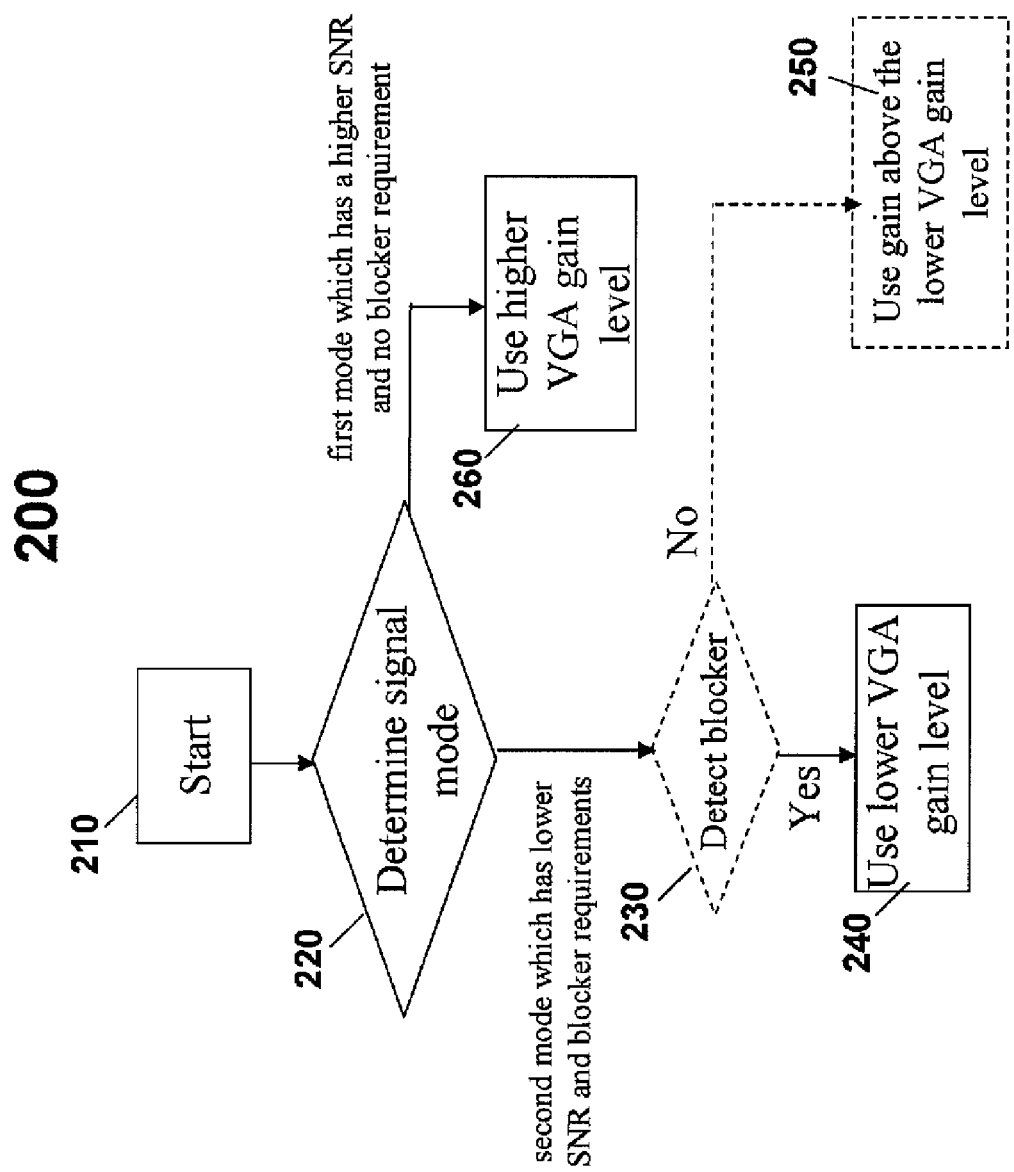
FIGS. 2 and 3 are flow charts illustrating examples of processes for operating the analog-to-digital converter and with automatic gain control.

FIG. 2 is a flow chart of an example of a process 200 for using an ADC. The process 200 can be used to reduce the dynamic range required of the ADC to process signals of multiple modes in a system such as a receiver. For ease of understanding, the process 200 is described in terms of the components of the schematic 100 of FIG. 1, though other components can be used. Also, the process 200 is described in terms of first and second modes. Each of the first and second modes as described below can represent a group of modes which share similar or overlapping requirements. The process 200 can be particularly useful to reduce the necessary ADC dynamic range of a single ADC used to process either a basic WCDMA or an HSDPA signal in a receiver.

The process 200 may allow for use of a single ADC to resolve signals of first and second signal modes, where the first signal mode has a lower SNR and/or a larger blocker requirement than a second signal mode. Accordingly, the second signal mode has a higher SNR and/or a smaller (or no) blocker requirement than the first signal mode. In some implementations, the first signal mode is HSPDA and the second signal mode is WCDMA. The ADC 131 can then be designed for a basic rate with, for example, QPSK modulation for a WCDMA system and a blocker detector in the AGC 131 can be used to calculate the blocker level at the input of the ADC 131.

The process 200 can begin (210) upon receipt of a signal, change in signal, or instruction regarding a modulation scheme or signal type (mode) from, for example, a component or the baseband. Such an instruction may denote that a currently received signal is one of several modes with which the system can operate (e.g., WCMDA or HSDPA). With the received signal, change in signal, or instruction, the signal mode is determined or otherwise inferred (220). If the mode is determined to be a first mode which includes a higher SNR (or SNQR) requirement than other available modes but no blocker requirement (e.g. HSDPA), the ADC 131 can be determined to be able to process the signal with the VGA 130 gain set to a higher level than other available gain levels so as to provide the higher SNR or SNQR. Accordingly, the AGC 132 can boost the VGA 130 gain to the higher gain level or maintain the gain if it is already at the higher level (260). The higher level can be the maximum gain of the VGA 130. The gain boost may be the difference of the SQNR requirements between the first and other modes. For WCDMA and HSDPA modes, for example, the difference can be approximately 30 dB. The AGC 132 or baseband can then monitor for a change in signal mode and the process can begin anew.

If, on the other hand, the mode is determined to be a second mode which includes a lower SNR requirement than the first mode and a blocker requirement (e.g. WCDMA), the ADC 131 can be determined to be able to resolve the signal with the VGA 130 gain set to a lower level than the higher gain level discussed above. The lower level of the gain may be sufficient to meet the less stringent SNR or SNQR requirements of the second mode and/or may allow for the increased power of a received blocker signal without exceeding saturation requirements of the ADC 131. Accordingly, the AGC 132 can reduce the VGA 130 gain to the lower level or maintain the gain if it is already at the lower level (240). The lower level can be the minimum gain of the VGA 130. The AGC 132 or baseband can then monitor for a change in situation and the process can begin anew.

Although not required to meet the second mode's requirements, in some implementations, the VGA 130 gain is nevertheless boosted in the absence of blocker signals while operating in the second mode. Specifically, after determining the mode is the second mode, the AGC 132 can proceed to determine whether the signal includes a blocker signal or other interference (230). If there is no blocker signal or little interference detected by the AGC 132, for example, in the order of quantization and thermal noise level, the AGC 132 can set the VGA 130 to a gain level which is greater than the lower level (250). The gain level can be greater than the lower level while being less than or equal to the higher level.

When more than one signal mode has a lower SNR with a blocker requirement, the dynamic range of the ADC 131 can be designed to have a highest lower dynamic range such that the ADC 131 can resolve all signals of the lower SNR modes provided that the ADC 131 can also resolve signals of higher SNRs but no blocker mode after the higher SNR signals are boosted by the VGA 130 gain. The process 200 described above is an example and various ADC dynamic range processes can be used based on the techniques of this disclosure.

Figure 3:
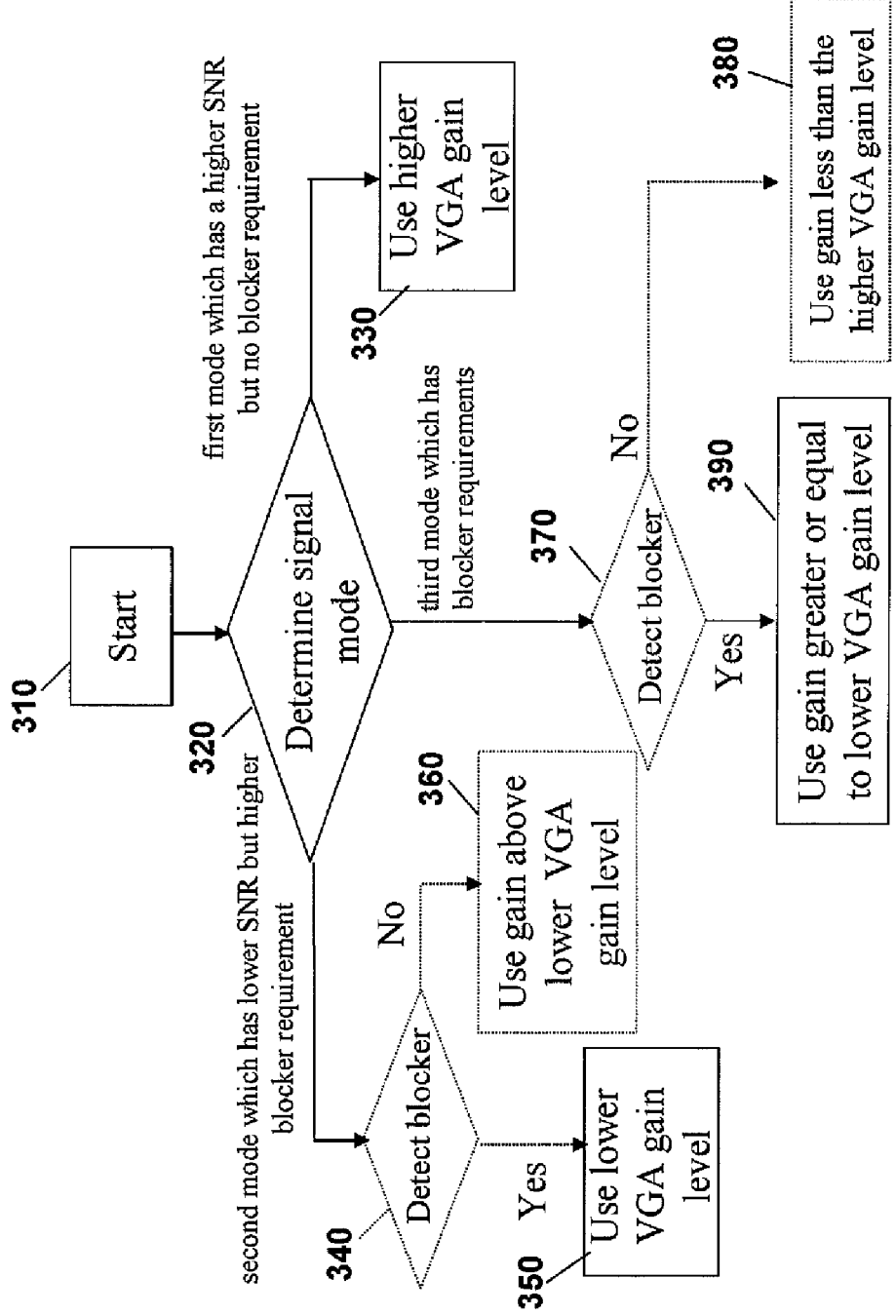

FIG. 3 is a flow chart of an example of a process 300 for using an ADC. The process 300 can be used to reduce the dynamic range required of the ADC to process signals of multiple modes in a system such as a receiver. For ease of understanding, the process 300 is described in terms of the components of the schematic 100 of FIG. 1, though other components can be used. Also, the process 300 is described in terms of first, second, and third modes. Each of the first, second, and third modes as described below can represent a group of modes which share similar or overlapping requirements.

The process 300 can begin (310) upon receipt of a signal, change in signal, or instruction regarding a mode from, for example, a component or the baseband. With the received signal, change in signal, or instruction, the mode is determined or otherwise inferred (320). If the mode is determined to be a first mode which includes a higher SNR or SNQR requirement than other modes and no blocker requirement, the ADC 131 can be determined to be able to process the signal with the VGA 130 gain set to a higher level than other available gain levels so as to provide the higher SNR or SNQR. Accordingly, the AGC 132 can boost the VGA 130 gain to the higher gain level or maintain the gain if it is already at the higher level (330). The higher level can be the maximum gain of the VGA 130. The AGC 132 or baseband can then monitor for a change in situation and the process can begin anew.

If, on the other hand, the mode is determined to be a second mode which includes a lower SNR requirement but a higher blocker requirement than the first mode. The ADC 131 can be determined to be able to process the signal with the VGA 130 gain set to a lower level than the higher gain level discussed above. The lower level of the gain may be sufficient to meet the less stringent SNR or SNQR requirements of the second mode and may allow for the increased power of a received blocker signal without exceeding saturation requirements of the ADC 131. Such an ADC 131 can be sufficient to cover the weakest desired signal and the strongest blocker level of, for an example, a basic WCDMA signal. Accordingly, the AGC 132 can reduce the VGA 130 gain to the lower level or maintain the gain if it is already at the lower level (350). The lower level can be the minimum gain of the VGA 130. The AGC 132 or the DSP 135 can then monitor for a change in situation and the process can begin anew.

Although not required to meet the second mode's requirements, in some implementations, the VGA 130 gain is nevertheless boosted in the absence of blocker signals while operating in the second mode. Specifically, after determining the mode is the second mode, the AGC 132 can proceed to determine whether the signal includes a blocker signal or other interference (340). If there is no blocker signal or little interference detected by the AGC 132, for example, in the order of quantization and thermal noise level, the AGC 132 can set the VGA 130 to a gain level which is greater than the lower level (360). The gain level can be greater than the lower level while being less than the higher level.

If the mode is determined to be a third mode, which includes a blocker and an SNR requirement similar to or between the SNR requirements of the first and second modes, the VGA 130 gain can be set to a level dependent on the SNR requirement and the presence of a blocker signal. That is, in the third mode, the VGA 130 gain can vary such that it is set higher when a blocker signal is not present than it is set when a blocker signal is present. The varying level of the gain can provide the higher SNR or SNQR levels if desired or required while also allowing for blocker signals without saturating the ADC 131.

After determining the mode is the third mode, the AGC 132 can proceed to determine whether the signal includes a blocker signal or other interference (370). If there is no blocker signal or little interference detected, the AGC 132 can set the VGA 130 to a gain level which is greater than the lower level of the second mode (380) such as a gain less than or equal to the higher gain level of the first mode without saturating the ADC 131. Thereafter, if the AGC 132 determines the signal includes a blocker signal (370), the AGC 132 can reduce the VGA 130 gain level (380). The reduced VGA 130 gain level can be greater than or equal to the lower level of the second mode without saturating the ADC 131. The AGC 132 or the DSP 135 can then monitor for a change in situation and the process can begin anew.

Figure 4:
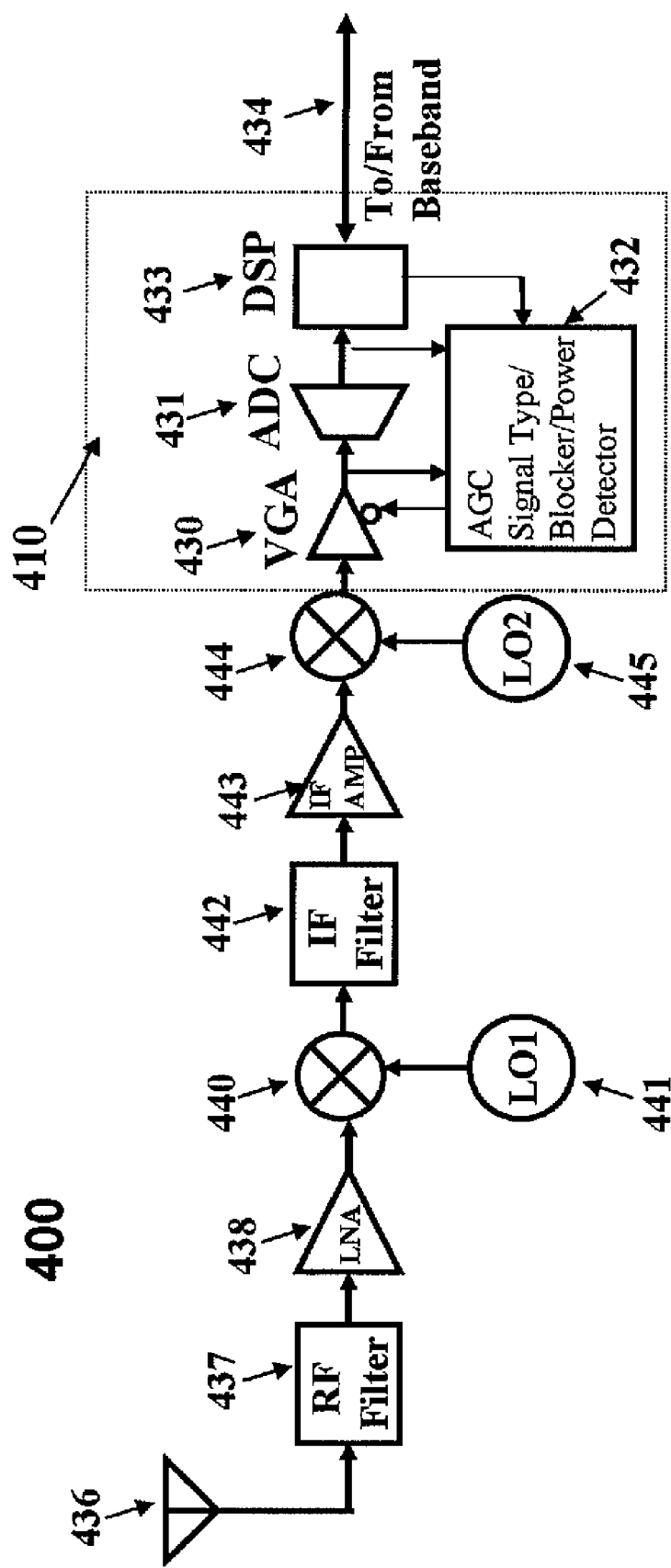
FIG. 4 is a schematic of an example of a dual-band low intermediate frequency receiver.
Figure 5:
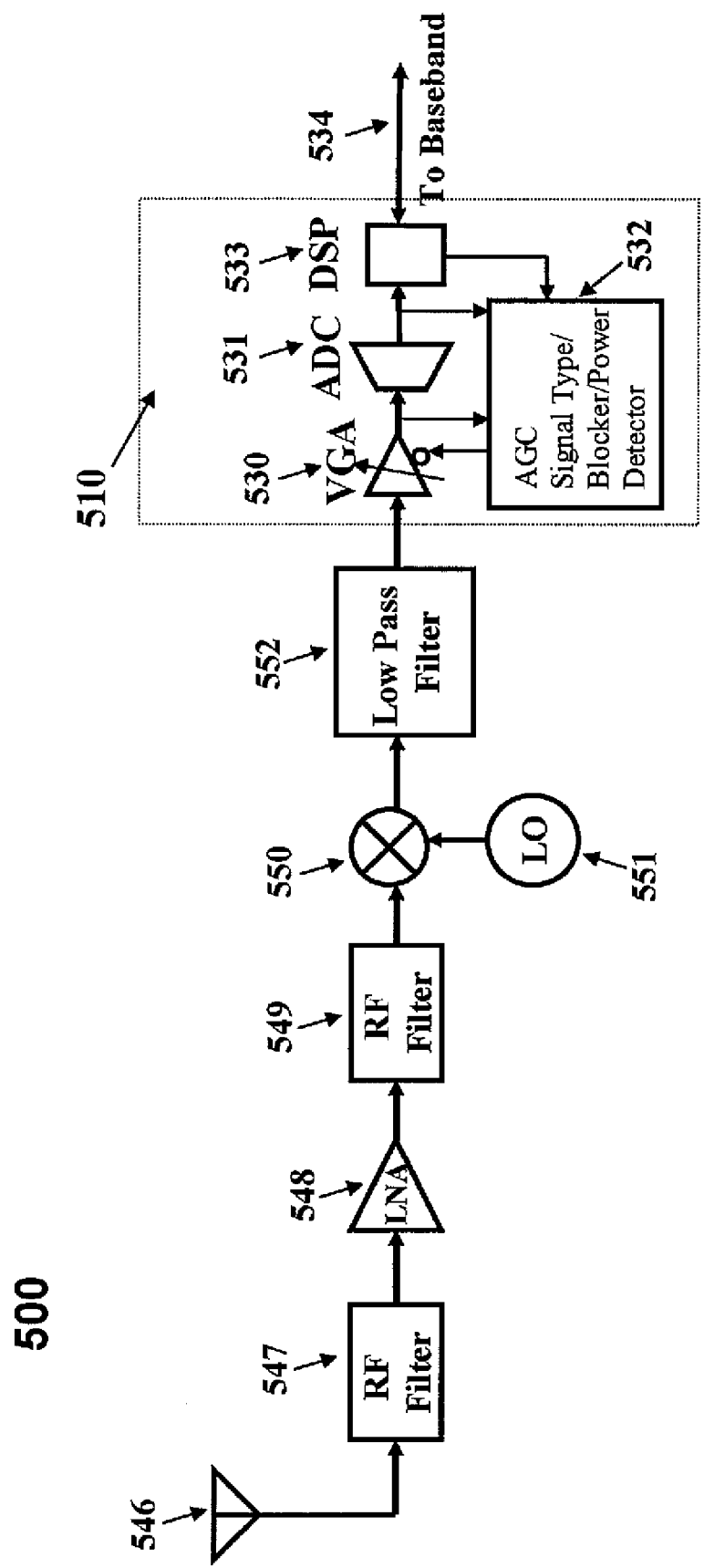
FIG. 5 is a schematic of an example of a direct-conversion receiver.

The disclosed techniques can be used with wireless communication systems. For example, the disclosed techniques can be used with receivers, transmitters, and transceivers, such as the receiver, transmitter, and/or transceiver architectures for superheterodyne receivers, image-rejection (e.g., Hartley, Weaver) receivers, zero-intermediate frequency (IF) receivers, low-IF receivers, direct-up transceivers, two-step up transceivers, and other types of receivers and transceivers for wireless and wireline technologies. FIGS. 4 and 5 are schematics of two examples of systems in which the techniques described above can be used.

In particular, FIG. 4 is a schematic 400 of a low IF receiver. In the schematic 400, an RF signal arriving at an antenna 436 passes through an RF filter 437, a low noise amplifier (LNA) 438, and into a first mixer 440. The first mixer 440 translates the RF signal down to an intermediate frequency by mixing it with a signal produced by a first local oscillator (LO) 441. Undesired mixer products in the IF signal are filtered out with an IF filter 442. The filtered IF signal then enters an IF amplifier stage 443, whose output feeds into a second mixer 444 that translates it down to yet another intermediate frequency or baseband frequency by mixing it with the signal produced by a second LO 445. The mixed signal can be sent to a dynamic ADC circuit 410 similar to the schematic 100 of FIG. 1.

The dynamic ADC circuit 410 can include a VGA 430, an ADC 431, an AGC 432 with a feedback loop, and a filter embedded in a DSP 433. The processes and techniques used in FIGS. 2 and 3 can be applied to the receiver 400 and its dynamic ADC circuit 410. The output signal of the second mixer 444 can be sent to the VGA 430 then digitized by the ADC 431. The dynamic range of the ADC 431 can be altered by adjusting the gain of the VGA 430 with the AGC 432. In adjusting the gain of the VGA 430, the AGC 432 can be configured to consider various information, such as, signal mode, SNR and SQNR requirements, blocker size, and/or signal power. The output signal from the ADC 431 is then sent to the DSP 433 or a baseband for interference removing and further system processing. Tuning into a particular channel within the band-limited RF signal is accomplished by varying the frequency of each LO 441 and 445.

In another example, FIG. 5 is a schematic 500 of an example of a direct-conversion receiver. In the schematic 500 an antenna 546 passes an RF signal through a first bandpass RF filter 547 into an LNA 548. The signal then proceeds through a second RF filter 549, yielding a band-limited RF signal, which then enters a mixer 550 and mixes with an LO frequency produced by an LO 551. The output of the mixer 550 is coupled into a low-pass analog filter 552 before proceeding into a dynamic ADC circuit 510 similar to the schematic 100 of FIG. 1.

The dynamic ADC circuit 510 can include a VGA 530, an ADC 531, an AGC 532 with a feedback loop, and a filter embedded in a DSP 533. The processes and techniques used in FIGS. 2 and 3 can be applied to the receiver and the dynamic ADC circuit. The output of the low-pass analog filter 552 is coupled to the VGA 530 to be amplified before being digitized by the ADC 531. The dynamic range of the ADC 531 can be altered by adjusting the gain of the VGA 530 with the AGC 532. In adjusting the gain of the VGA 530, the AGC 532 can be configured to consider various information, such as, signal mode, SNR and SQNR requirements, blocker size, and/or signal power. The output signal from the ADC 531 is then sent to the DSP 533 or a baseband for interference removal and further processing by the remainder of the communications system.

In some implementations, the positions of filters, mixers, amplifiers and ADC can be exchanged from the disclosed figures with minimal change in circuit functionality. Various topologies for circuit models can also be used, other than what is shown in the figures. The exemplary designs shown can use MOSFET process technology, but can also use other process technologies, such as BiCMOS (Bipolar-CMOS) process technology, or Silicon Germanium (SiGe) technology. In some implementations, switches can be implemented as transmission gate switches. The circuits can be single-ended or fully-differential circuits.

The system can include other components, where the circuit can couple with those components. Some of the components may include computers, processors, clocks, radios, signal generators, counters, test and measurement equipment, function generators, oscilloscopes, phase-locked loops, frequency synthesizers, phones, wireless communication devices, and components for the production and transmission of audio, video, and other data. The number and order of variable gain and filter stages can vary. In addition the number of controllable steps, as well as the steps sizes of each of the stages of gain can also vary.

What is claimed is:

1. A method comprising:
   receiving a signal;
   determining whether a signal mode of the signal is a first signal mode or a second signal mode;
   adjusting a gain of a variable gain amplifier to:
      a first gain value if the signal mode of the signal is determined to be the first signal mode, or
      a second gain value if the signal mode of the signal is determined to be the second signal mode, wherein the first signal mode comprises a requirement for a signal to noise ratio or signal to quantization noise ratio that is higher than a signal to noise ratio or signal to quantization ratio of a requirement of the second signal mode and the first gain value comprises a higher value than the second gain value;
   amplifying the signal with the variable gain amplifier by the first gain value or the second gain value; and
   converting the signal to a digital signal with an analog to digital converter after the signal is amplified with the variable gain amplifier by the first gain value or the second gain value.

2. The method of claim 1 wherein the determining whether the signal mode of the signal is the first signal mode or the second signal mode includes receiving an instruction signal at an automatic gain controller indicating that the signal is the first signal mode or that the signal is the second signal mode.

3. The method of claim 1 wherein:
   the adjusting the gain of the variable gain amplifier to the first gain value includes sending a first control signal from an automatic gain controller to the variable gain amplifier; and
   the adjusting the gain of the variable gain amplifier to the second gain value includes sending a second control signal from the automatic gain controller to the variable gain amplifier.

4. The method of claim 1 wherein the signal as amplified by the first gain value enables the analog to digital converter to meet the higher signal to noise ratio or signal to quantization noise ratio and the signal as amplified by the second gain value does not enable the analog to digital converter to meet the higher signal to noise ratio or signal to quantization noise ratio.

5. The method of claim 4 wherein the first signal mode comprises an High-Speed Downlink Packet Access and the second signal mode comprises a basic Wideband Code Division Multiple Access.

6. A method comprising:
   receiving a signal;
   determining whether a signal mode of the signal is a first signal mode or a second signal mode;
   adjusting a gain of a variable gain amplifier to:
      a first gain value if the signal mode of the signal is determined to be the first signal mode, or
      a second gain value if the signal mode of the signal is determined to be the second signal mode;
   amplifying the signal with the variable gain amplifier by the first gain value or the second gain value;
   converting the signal to a digital signal with an analog to digital converter after the signal is amplified with the variable gain amplifier by the first gain value or the second gain value; and
   monitoring the signal for an interference.

7. The method of claim 6 wherein the monitoring of the signal for the interference is initiated based on the determination that the signal mode of the signal is the second signal mode and maintained only when the signal mode of the signal is determined to be of the second signal mode, wherein the second signal mode includes an interference or sensitivity requirement.

8. The method of claim 7 wherein the signal as amplified by the first gain value does not enable the analog to digital converter to meet the interference or sensitivity requirement and the signal as amplified by the second gain value enables the analog to digital converter to meet the interference or sensitivity requirement.

9. The method of claim 6 further comprising:
   determining the signal includes the interference based on the monitoring of the signal, and
   wherein the adjusting the gain of the variable gain amplifier to the second gain value based on the determination that the signal mode of the signal is the second signal mode includes adjusting the gain of the variable gain amplifier to the second gain value in response to the determination that the signal includes the interference.

10. The method of claim 6 further comprising:
    determining that the signal does not include the interference based on the monitoring of the signal; and
    adjusting the gain of the variable gain amplifier to a third gain value based on the determination that the signal does not include the interference, wherein the third gain value is between the second gain value and the first gain value.

11. The method of claim 6 further comprising:
    determining that the signal mode of the signal is a third signal mode, wherein the third signal mode comprises a requirement for a signal to noise ratio or signal to quantization noise ratio that is higher than a signal to noise ratio or signal to quantization noise ratio of a requirement of the second signal mode;
    adjusting the gain of the variable gain amplifier to a fourth gain value after the determination that the signal mode of the signal is the third signal mode, wherein the fourth gain value is less than the first gain value;
    amplifying the signal with the variable gain amplifier by the fourth gain value; and converting the signal to the digital signal with the analog to digital converter after the signal is amplified by the fourth gain value with the variable gain amplifier.

12. The method of claim 11 wherein the fourth gain value is equal to or greater than the second gain value.

13. The method of claim 11 further comprising:
determining whether the signal includes the interference based on the monitoring of the signal for the interference;
after determining that the signal mode is the third signal mode, adjusting the gain of the variable gain amplifier to a fifth gain value if the signal does not include the interference, wherein the fifth gain value is less than the first gain value;
amplifying the signal with the variable gain amplifier by the fifth gain value; and
converting the signal to the digital signal with the analog to digital converter after the signal is amplified by the fifth gain value with the variable gain amplifier.

14. The method of claim 13 wherein the fifth gain value is greater than the second gain value.

15. The method of claim 6 wherein monitoring the signal for the interference comprises monitoring a power level of the signal.

16. A system comprising:
a variable gain amplifier configured to amplify a signal with an adjustable gain;
a gain control component configured to:
adjust a gain of the variable gain amplifier to a first gain value if a signal mode of the signal is determined to be a first signal mode, and
adjust the gain of the variable gain amplifier to a second gain value if the signal mode of the signal is determined to be a second signal mode, wherein the second gain value is different than the first gain value, the first signal mode comprises a requirement for a signal to noise ratio or signal to quantization noise ratio that is higher than a signal to noise ratio or signal to quantization noise ratio of a requirement of the second signal mode, the second signal mode also includes an interference or sensitivity requirement, and the first gain value is higher than the second gain value; and
an analog to digital converter configured to convert the signal to a digital signal after the signal has been amplified by the variable gain amplifier with the first gain value or the second gain value.

17. The system of claim 16 wherein the gain control component is configured to:
receive an instruction signal indicating that the signal mode of the signal is the first signal mode; or
receive an instruction signal indicating that the signal mode of the signal is the second signal mode.

18. The system of claim 16 wherein:
the analog to digital converter is configured to meet the second signal mode's signal to noise ratio or signal to quantization noise ratio and the interference or sensitivity requirement in converting the signal to the digital signal after the signal has been amplified by the second gain value; and
the analog to digital converter is configured to meet the first signal mode's signal to noise ratio or signal to quantization noise ratio in converting the signal to the digital signal after the signal has been amplified by the first gain value.

19. The system of claim 16 wherein:
the gain control component is configured to adjust the gain of the variable gain amplifier to a fourth gain value if the signal mode of the signal is determined to be a third signal mode, wherein the third signal mode comprises a requirement for a signal to noise ratio or signal to quantization noise ratio that is higher than a signal to noise ratio or signal to quantization noise ratio of a requirement of the second signal mode and the fourth gain value is equal to or greater than the second gain value; and
the analog to digital converter is configured to convert the signal to the digital signal after the signal has been amplified by the fourth gain value.

20. The system of claim 19 wherein the gain control component is configured to adjust the gain of the variable gain amplifier to a fifth gain value if the signal mode of the signal is determined to be a third signal mode and the signal is determined not to include the interference, wherein the fifth gain value is less than the first gain value, and wherein the analog to digital converter is configured to convert the signal amplified to the digital signal by the fifth gain value.

21. A system comprising:
a variable gain amplifier configured to amplify a signal with an adjustable gain;
a gain control component configured to:
adjust a gain of the variable gain amplifier to a first gain value if a signal mode of the signal is determined to be a first signal mode,
adjust the gain of the variable gain amplifier to a second gain value if the signal mode of the signal is determined to be a second signal mode, wherein the second gain value is different than the first gain, and
monitor the signal for an interference; and
an analog to digital converter configured to convert the signal to a digital signal after the signal has been amplified by the variable gain amplifier with the first gain value or the second gain value.

22. The system of claim 21 wherein, to monitor the signal for the interference, the gain control component is configured to receive and monitor a power of an input signal to the variable gain amplifier.

23. The system of claim 21 wherein the gain control component is configured to:
initiate monitoring of the signal for the interference based on the determination that the signal mode of the signal is the second signal mode; and
maintain monitoring of the signal for the interference only when the signal mode of the signal is determined to be the second signal mode,
wherein the second signal mode includes an interference requirement and a sensitivity requirement.

24. The system of claim 23 wherein the analog to digital converter is configured to meet the interference and sensitivity requirements in converting the signal to the digital signal after it has been amplified by the second gain value.

25. The system of claim 23 wherein the first signal mode comprises a requirement for a signal to noise ratio or signal to quantization noise ratio that is higher than a signal to noise ratio or signal to quantization noise ration of a requirement of the second signal mode and the first gain value is higher than the second gain value.

26. The system of claim 21 wherein:
the gain control component is configured to adjust the gain of the variable gain amplifier to the second gain value if the signal mode of the signal is determined to be the second signal mode and if the monitoring of the signal does not result in a determination that the signal includes the interference; and the analog to digital converter is configured to convert the signal to the digital signal after it has been amplified by the second gain value.

27. A receiver comprising:
an antenna configured to receive a signal;
a radio frequency filter configured to filter the received signal;
a low noise amplifier configured to amplify the signal after it has been filtered by the radio frequency filter;
a mixer configured to mix the signal with a local oscillator signal after it has been amplified by the low noise amplifier;
a variable gain amplifier configured to amplify the signal with an adjustable gain after it has been mixed by the mixer;
a gain control component configured to:
adjust a gain of the variable gain amplifier to a first gain value if a signal mode of the signal is determined to be a first signal mode or adjust the gain of the variable gain amplifier to a second gain value if a signal mode of the signal is determined to be a second signal mode, wherein the second gain value is different than the first gain value; and
an analog to digital converter configured to convert the signal to a digital signal after the signal has been amplified by the variable gain amplifier with the first gain value or the second gain value.

28. A method comprising:
receiving a signal, wherein a signal mode of the signal is initially a first signal mode and later adjusted to a second signal mode;
determining that the signal mode of the signal is the first signal mode;
adjusting a gain of a variable gain amplifier to a first gain value after the determination that the signal mode of the signal is the first signal mode;
amplifying the signal with the variable gain amplifier by the first gain value;
converting the signal to a digital signal with an analog to digital converter after the signal is amplified by the first gain value with the variable gain amplifier;
determining that a signal mode of the signal is the second signal mode;
adjusting the gain of the variable gain amplifier to a second gain value after the determination that the signal mode of the signal is the second signal mode, wherein the second gain value is different than the first gain value;
amplifying the signal with the variable gain amplifier by the second gain value; and
converting the signal to a digital signal with the analog to digital converter after the signal is amplified by the second gain value with the variable gain amplifier.

* * * * *